(12) United States Patent
Usui et al.

(10) Patent No.: US 7,750,473 B2
(45) Date of Patent: Jul. 6, 2010

(54) LSI WIRING PATTERN FOR REDUCED DEFORMATION AND CRACKING

(75) Inventors: Takamasa Usui, Tokyo (JP); Hideki Shibata, Kanagawa-ken (JP); Tadashi Murofushi, Kanagawa-ken (JP); Masakazu Jimbo, Kanagawa-ken (JP); Hiroshi Hirayama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/960,209

(22) Filed: Dec. 19, 2007

(65) Prior Publication Data

US 2008/0203573 A1    Aug. 28, 2008

(30) Foreign Application Priority Data

Dec. 19, 2006    (JP)    ............... 2006-341761

(51) Int. Cl.
    *H01L 23/48*    (2006.01)
(52) U.S. Cl. ............... 257/758; 257/776; 257/E23.144; 257/E23.145
(58) Field of Classification Search ................ 257/758, 257/775, 759, 760, 776, E23.144, E23.145
    See application file for complete search history.

(56) References Cited

U.S. PATENT DOCUMENTS 6,710,449 B2    3/2004    Hyoto et al.

2002/0195712 A1*    12/2002    Nohsoh et al. ............... 257/758
2003/0222349 A1    12/2003    Tomohisa et al.
2004/0222528 A1*    11/2004    Kunikiyo ............... 257/758

FOREIGN PATENT DOCUMENTS

| JP | 2001-351972 | 12/2001 |
| JP | 3481222 | 10/2003 |
| JP | 2003-347401 | 12/2003 |

OTHER PUBLICATIONS

Junji Noguchi et al., "Misalignment-Free Air Gap (MFAG) Interconnect with Via Base Structure for 45/65nm Node and Below", Proceeding of IEEE IITC 2006, pp. 167-169.
R. Daamen et al., "Air Gap Integration for the 45nm Node and Beyond.", Proceeding of IEEE IITC 2005, 3 pages.

* cited by examiner

*Primary Examiner*—Minh-Loan T Tran
(74) *Attorney, Agent, or Firm*—Oblon, Spivak, McClelland, Maier & Neustadt, L.L.P.

(57) ABSTRACT

Provided is a semiconductor device including first and second wiring layers, and dummy and conductive patterns. The first and second wiring layers each have a hollow structure, and are stacked vertically adjacent to each other on a semiconductor substrate. The dummy pattern is formed in the first wiring layer, and does not function as a signal line. The conductive pattern is formed in the second wiring layer. The dummy and conductive patterns have an overlapping portion where these patterns overlap each other, and a non-overlapping portion where these patterns overlap each other, as viewed from above the semiconductor substrate.

16 Claims, 9 Drawing Sheets

Figure 1:
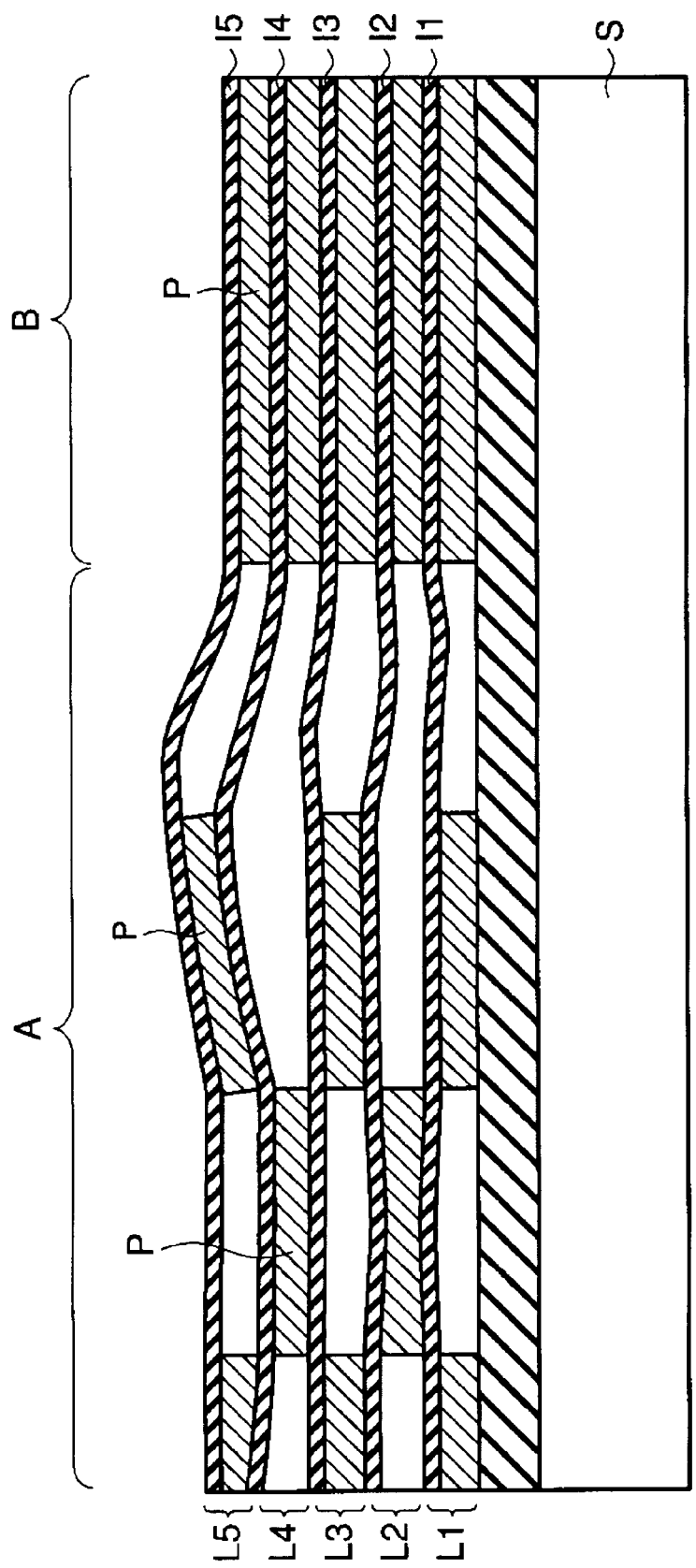

| Length of the overlapped portion (%) | Structure |
|---|---|
| 0nm (0%) |  |
| 200nm (20%) |  |
| 500nm (50%) |  |
| 700nm (70%) |  |
| 1000nm (100%) |  | solid line : upper layer
broken line : lower layer solid line : upper layer
broken line : lower layer Pu or Pd : dummy pattern

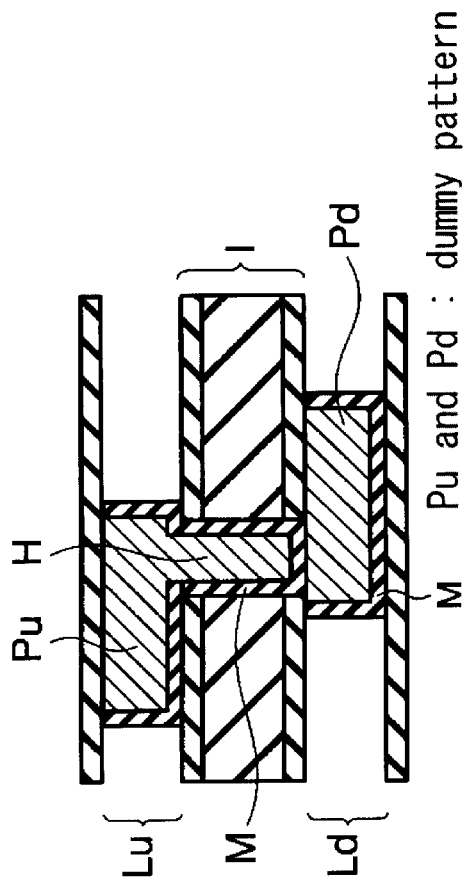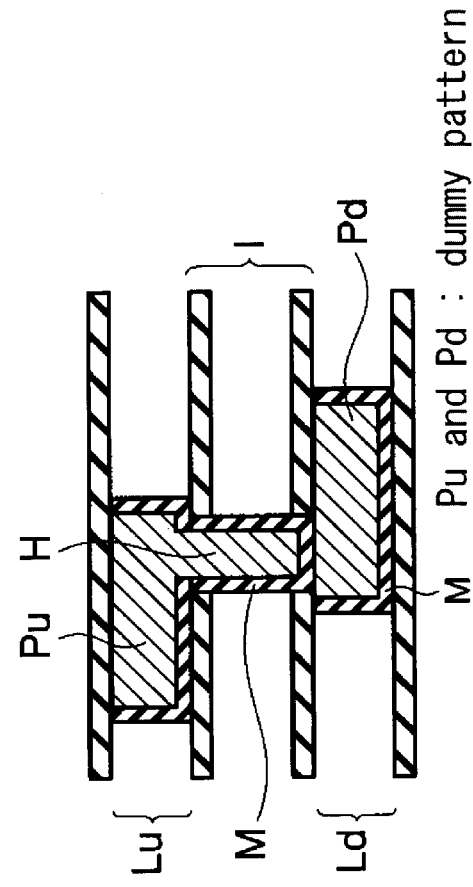

LSI WIRING PATTERN FOR REDUCED DEFORMATION AND CRACKING

CROSS REFERENCE TO RELATED APPLICATION

This application is based upon and claims the benefit of priority from Japanese Patent Application No. 2006-341761, filed on Dec. 19, 2006, the entire contents of which are incorporated herein by reference.

BACKGROUND

It is very important to reduce parasitic capacitance of conductive lines in a wiring layer in order to achieve a higher performance of an LSI. This is particularly important to enable faster signal transmission. The ultimate technique for reducing parasitic capacitance is to form a hollow structure having a complete cavity between each adjacent two signal lines in the wiring layer.

However, in a semiconductor device including a wiring layer having such a hollow structure, nothing exists between each adjacent two signal lines in the wiring layer. Accordingly, in this case, a conductive pattern (signal line, dummy pattern or the like) in the wiring layer must serve as a main support for an interlayer insulating film serving as a floor or a ceiling of the wiring layer.

In such a case, when the conductive pattern (made of metal, for example) is thermally expanded with the increase in temperature, the interlayer insulating film is deformed. This phenomenon makes the surface of the interlayer insulating film uneven although the surface should be even.

The uneven surface of the interlayer insulating film causes the following problem. The focal point is not considerably disposed during a photo engraving process (PEP), so that a fine accurate pattern cannot be drawn on it. During a damascene process by using chemical mechanical polishing method, polishing is performed excessively or insufficiently.

SUMMARY

In one aspect of the present invention, a semiconductor device of an embodiment includes first and second wiring layers, and dummy and conductive patterns. The first and second wiring layers each have a hollow structure, and are stacked vertically adjacent to each other on a semiconductor substrate. The dummy pattern is formed in the first wiring layer, and does not function as a signal line. The conductive pattern is formed in the second wiring layer. The dummy and conductive patterns have an overlapping portion where these patterns overlap each other, and a non-overlapping portion where these patterns do not overlap each other, as viewed from above the semiconductor substrate.

In another aspect of the present invention, a semiconductor device of another embodiment includes first and second wiring layers, and dummy and conductive patterns. The first and second wiring layers each have a hollow structure, and are stacked vertically adjacent to each other on a semiconductor substrate. The dummy pattern is formed in the first wiring layer, and does not function as a signal line. The conductive pattern is formed in the second wiring layer. On the dummy pattern, a part of the hollow structure in the second wiring layer and a part of the conductive pattern in the second wiring layer are placed. Under the conductive pattern, a part of the hollow structure in the first wiring layer and a part of the conductive pattern in the second wiring layer are placed.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

Figure 2:
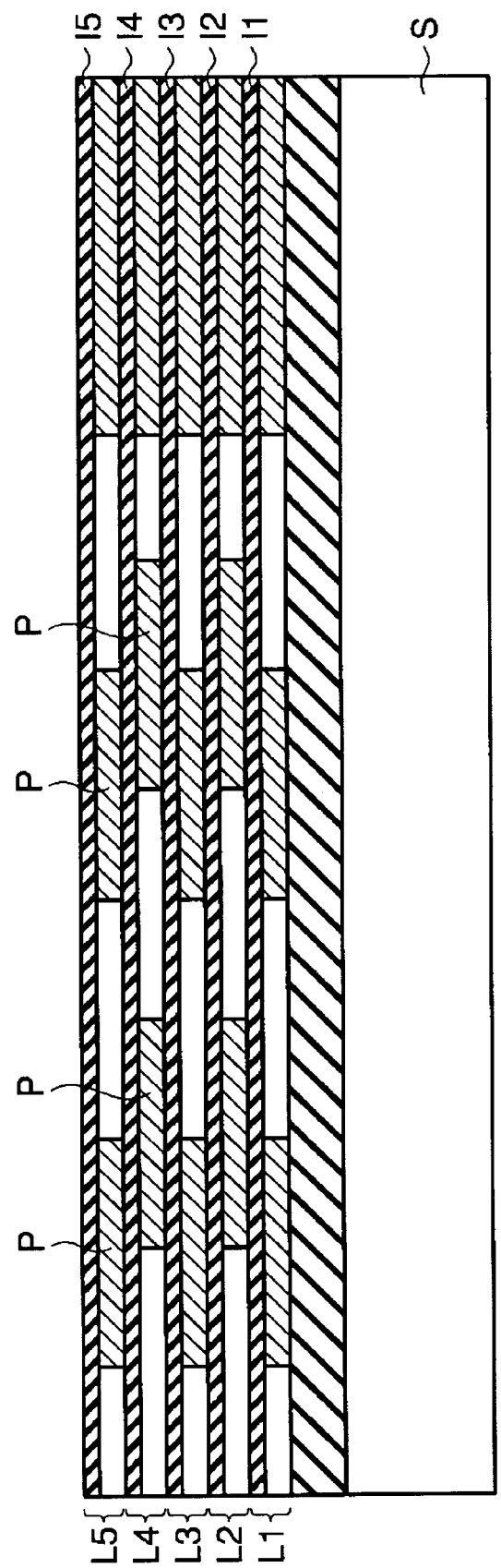
Figure 3:
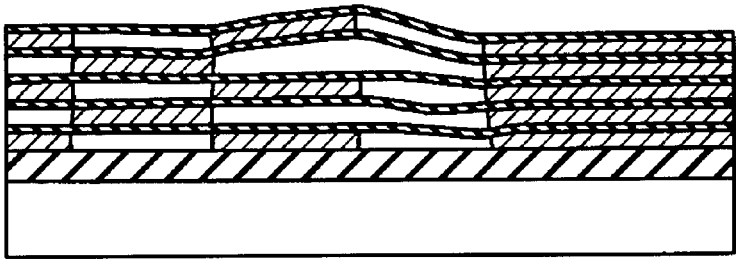
Figure 3:
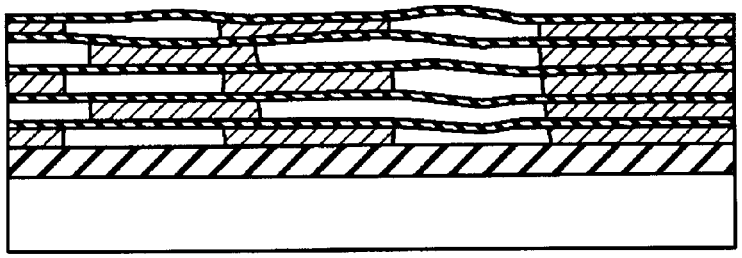
Figure 3:
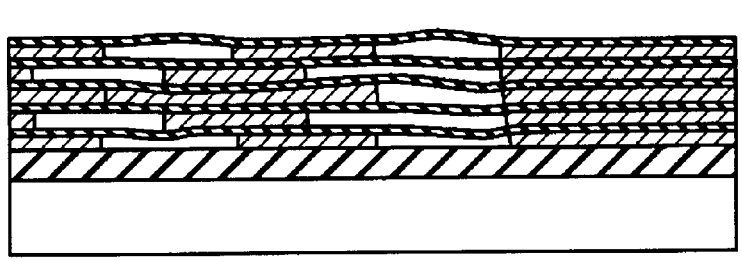
Figure 3:
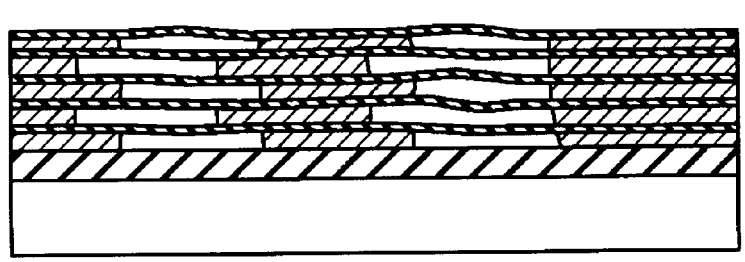
Figure 3:
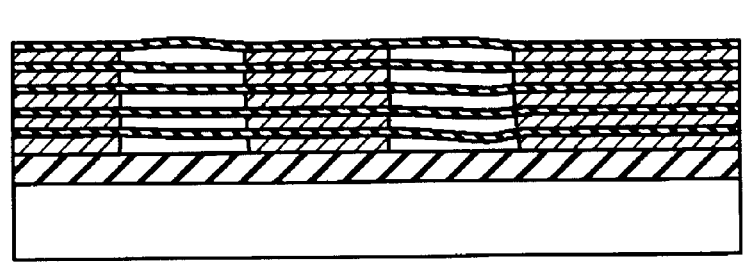
Figure 4:
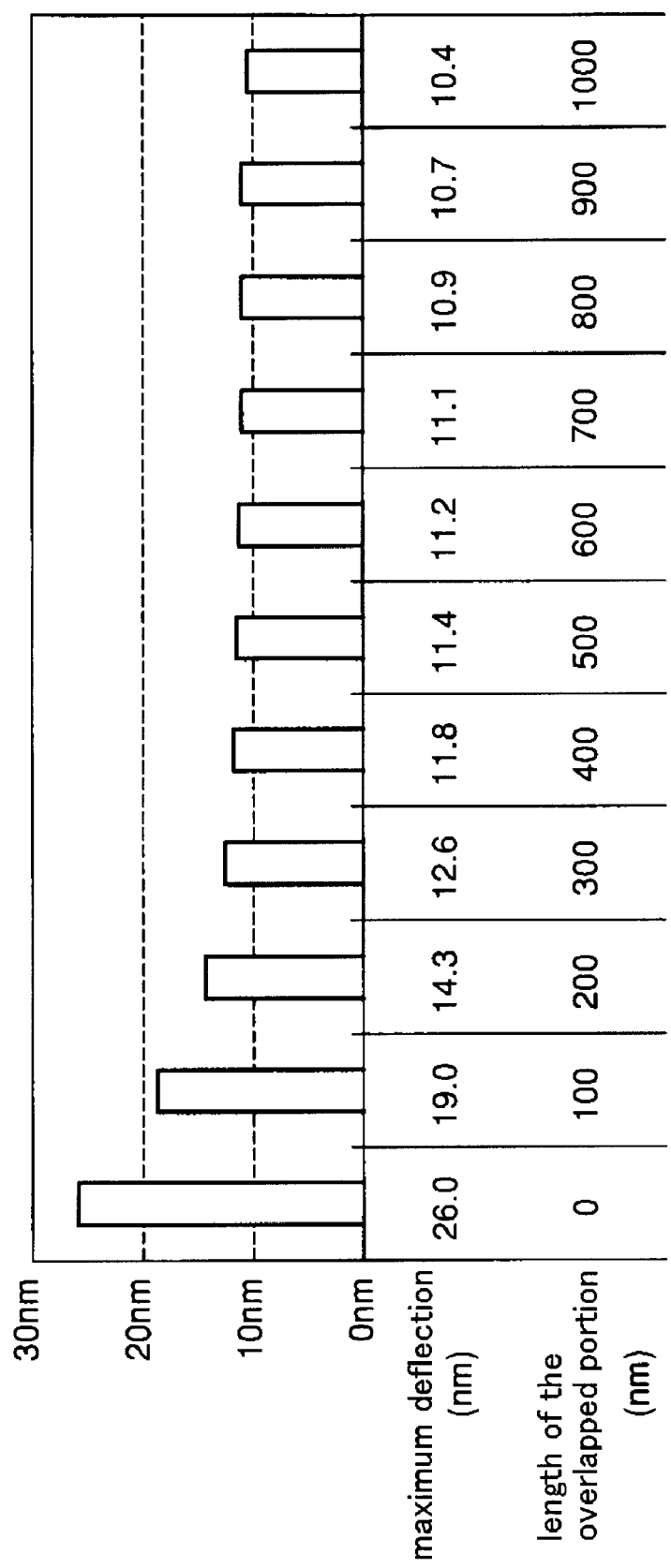
Figure 5:
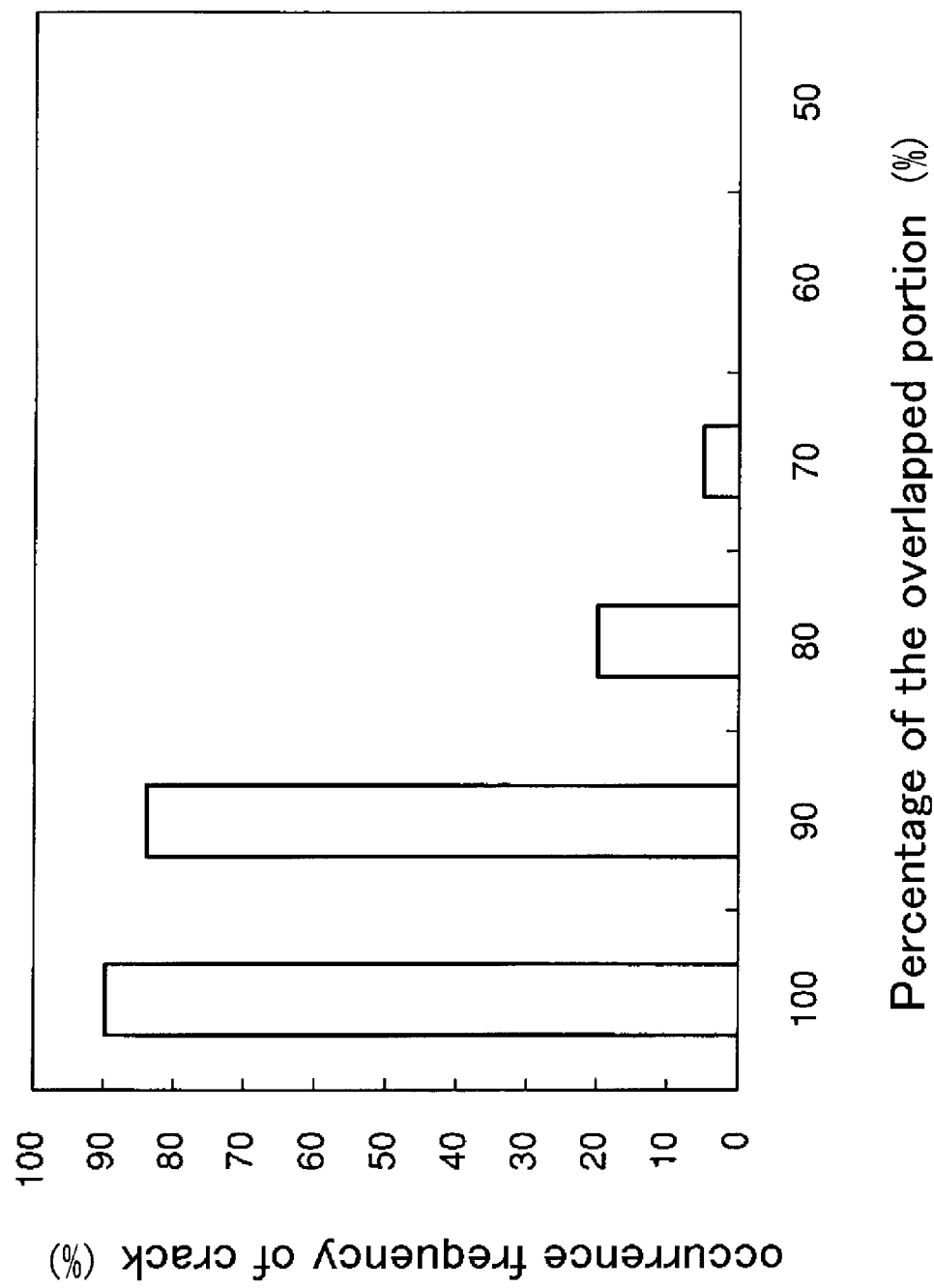
Figure 6:
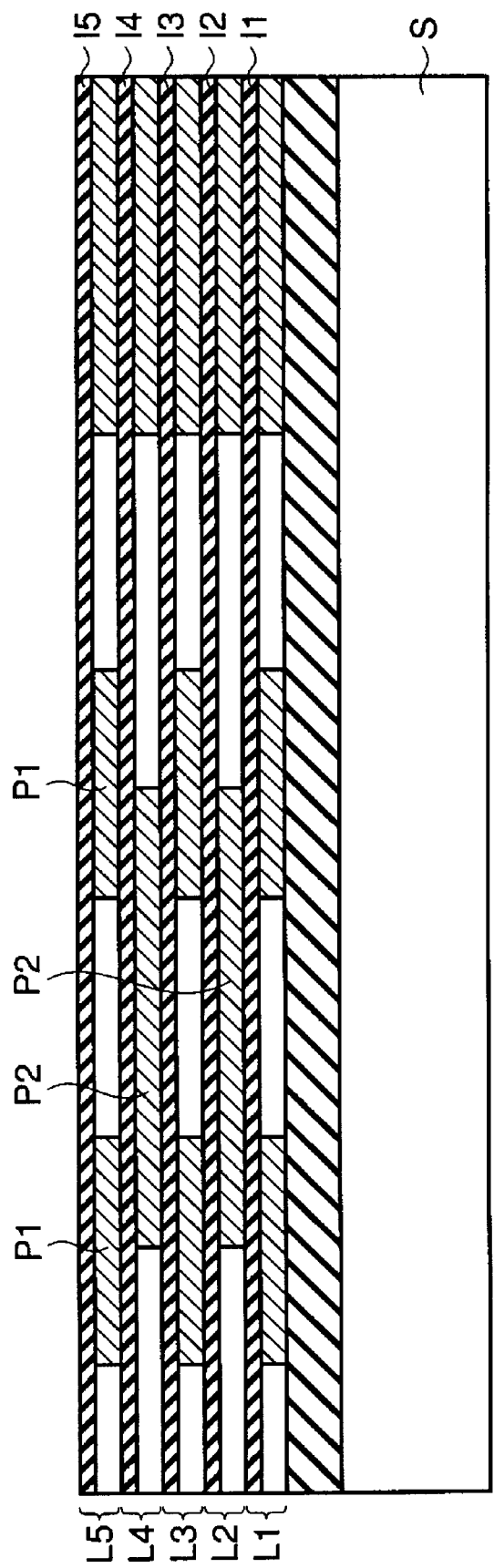
Figure 7:
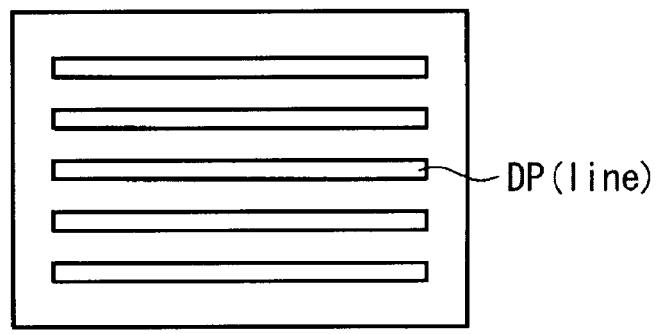
Figure 8:
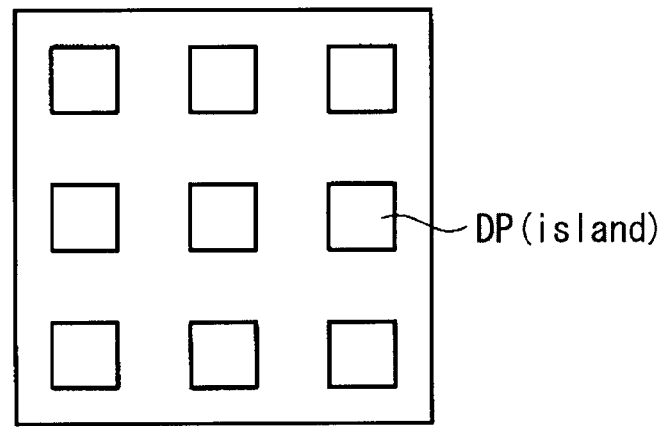
Figure 9:
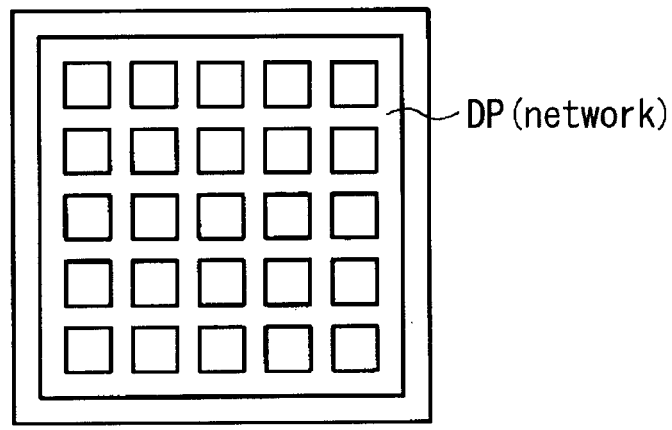
Figure 10:
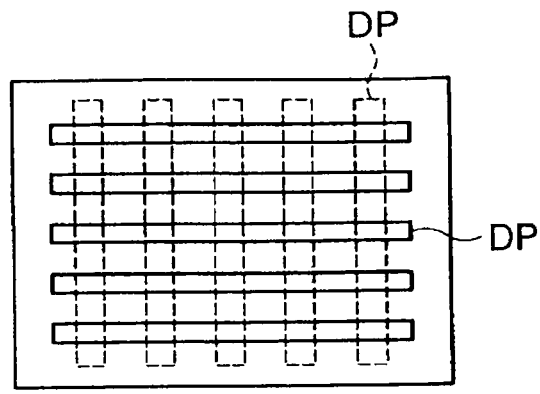
Figure 11:
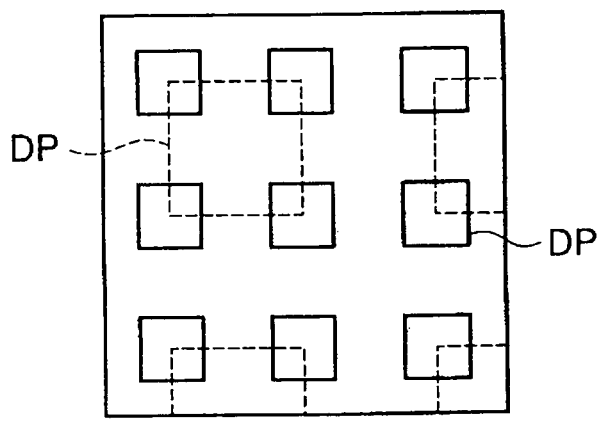
Figure 12:
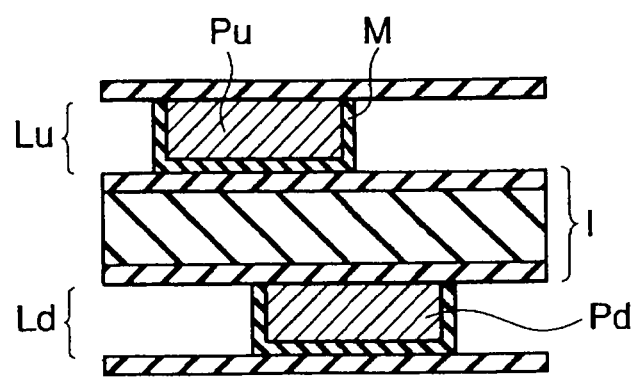

FIG. 1 shows the structure of a device as a comparative example.
FIG. 2 shows the structure of a device as an embodiment of the present invention.
FIG. 3 shows the simulation result of amount of deformation.
FIG. 4 shows the relationship between overlapping amount and amount of deformation.
FIG. 5 shows the relationship between overlapping amount and the occurrence frequency of crack.
FIG. 6 shows the structure of a modification of the device.
FIG. 7 shows a shape example of a dummy pattern.
FIG. 8 shows a shape example of a dummy pattern.
FIG. 9 shows a shape example of a dummy pattern.
FIG. 10 shows an example of overlapping.
FIG. 11 shows an example of overlapping.
FIG. 12 shows the structure of a device as an application example.
FIG. 13 shows the structure of a device as an application example.
FIG. 14 shows the structure of a device as an application example.

DETAILED DESCRIPTION

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

1. Summary

An embodiment of the present invention is intended to be applied to a semiconductor including a wiring layer with a hollow structure. Proposed is a layout effective to inhibit the deformation of an interlayer insulating film due to the increase in temperature in such a semiconductor device. In this layout, the conductive patterns in the first and second wiring layers are vertically adjacent to each other.

Among the conductive patterns in the first wiring layer, the embodiment of the present invention is intended to be applied to dummy patterns. Dummy patterns are conductive patterns that do not function as signal lines. As for the conductive patterns in the second wiring layer, the kind thereof (signal lines, dummy patterns or the like) is not particularly limited in the embodiment of the present invention.

In the embodiment of the present invention, a planar layout is employed in which the conductive patterns (dummy patterns) in the first wiring layer and the conductive patterns in the second wiring layer have an overlapping portion where these patterns overlap each other, and a non-overlapping portion where these patterns overlap each other, as viewed from above the semiconductor substrate.

In forming wiring layers, an increase in temperature during the stacking of an upper interlayer insulating film can deform a lower interlayer insulating film that has already been formed. However, the layout can prevent the deformation of interlayer insulating film even in such a case, for example.

2. Deformation of an Interlayer Insulating Film

First, the deformation of an interlayer insulating film is discussed.

When an LSI including a wiring layer with a hollow structure was produced, it became clear that the deformation of an interlayer insulating film was serious in an area in which a dummy pattern is placed.

This is assumed to be because dummy patterns are regularly arranged in an area where dummy patterns are placed, while conductive lines are arranged densely and irregularly in an area where conductive lines such as signal lines are placed.

Accordingly, it was tried to simulate the relationship between the layout of conductive patterns (dummy patterns) and the deformation of an interlayer insulating film.

FIG. 1 shows a simulation result of deformation of an interlayer insulating film.

This simulation was carried out on a two-dimensional basis.

Five wiring layers L1 to L5 were disposed on a semiconductor substrate S. Each wiring layer had a hollow structure. A conductive pattern P is assumed to be in an island shape (square: 1 μm×1 μm). Interlayer insulating films I1 to I5 were respectively disposed on the wiring layers L1 to L5 to serve as the floors or ceilings of the wiring layers.

The conductive patterns P were disposed in all of the wiring layers L1 to L5. In an area A, a layout was employed in which the conductive patterns P have no overlapping portion as viewed from above the semiconductor substrate S. In an area B, a layout was employed in which the conductive patterns P completely overlap as viewed from above the semiconductor substrate S.

In consideration of the temperature (350° C.) used in stacking an interlayer insulating film, the temperature was set to 330° C. (=350° C.–room temperature 20° C.).

As the materials for the conductive patterns P and the interlayer insulating films I1 to I5, the materials shown in Table 1 were employed.

TABLE 1

|  | Material | Young's modulus (GPa) | Thermal expansion ratio (ppm) |
|---|---|---|---|
| Conductive pattern P | Cu | 150 | 15.7 |
|  | Ta | 180 | 7 |
|  | Si | 130 | 3.5 |
| Interlayer insulating film I1-I5 | $SiO_2$ | 57 | 0.7 |
|  | $Si_xN_y$ | 98 | 0.5 |
|  | $SiC_xO_y$ | 2-20 | about 11 |
|  | Organic $CH_x$ | 1-10 | about 60 |
|  | $SiC_xO_yH_z$ | 1-10 | 10-15 |
|  | $SiC_xN_y$ | 100-120 | about 11 |
|  | $SiC_x$ | 30-50 | 10-15 |

In Table 1, copper (Cu) is shown as one of the materials for the conductive patterns P. This is because copper is generally used as a wiring material in a current LSI.

$SiO_2$, $Si_xN_y$, and the like are generally used for an interlayer insulating film. Recently, materials having lower dielectric constants than the above materials, such as $SiC_xO_y$, $SiC_xO_yH_z$, organic $CH_x$, are also used. When copper is used as the wiring material, $SiC_xN_y$, $SiC_x$ and the like are partially used for an interlayer insulating film to serve as a copper diffusion preventing film Accordingly, these insulating materials are given as one of parameters in performing simulation.

As can be seen from Table 1, between the conductive patterns P and the interlayer insulating films I1 to I5, there is a difference in Young's modulus that is considered as a mechanical property. In addition, different materials naturally have different thermal expansion coefficients.

Accordingly, in a case where a step which produces an increase in temperature is included in the production process, local deformation occurs due to the difference in Young's modulus, while the difference in an expansion amount between materials is caused due to the difference in thermal expansion coefficients thereof.

As a result, as shown in FIG. 1, the interlayer insulating films I1 to I5 are deformed (to be uneven). The deformation is particularly serious in the uppermost interlayer insulating film I5.

3. Embodiment

Embodiments will be described below.

(1) Structure of a Device

FIG. 2 shows the structure of the device according to the embodiment of the present invention.

On the semiconductor substrate S, multiple wiring layers (five layers in the present embodiment) L1 to L5 are stacked with insulating layers disposed in between. The interlayer insulating films I1 to I5 are respectively formed on the wiring layers L1 to L5 to serve as the floors or ceilings of the wiring layers.

A conductive patterns P are disposed in all of the wiring layers L1 to L5. The conductive patterns P are a dummy pattern or a conductive line such as a signal line. The embodiment of the present invention is assumed to be applied to an area in which a dummy pattern is disposed. Accordingly, at least one of the conductive patterns is a dummy pattern.

In an area between each adjacent two conductive patterns P in the wiring layers L1 to L5, a complete cavity is formed. That is, the wiring layers L1 to L5 have hollow structures.

The materials of the conductive patterns P and the interlayer insulating films I1 to I5 are not particularly limited. The kind of a gas with which the cavities are filled is also not particularly limited.

The conductive patterns P in the two wiring layers vertically adjacent to each other have an overlapping portion where these patterns overlap each other, and a non-overlapping portion where these patterns overlap each other, as viewed from above the semiconductor substrate S.

In such a structure, the overlapping portions of the conductive patterns P strengthen the structure itself.

Therefore, the deformation of the interlayer insulating film can be inhibited even when the temperature is increased during the production process.

(2) Amount of Overlapping

Then, the relationship between overlapping amount of the conductive patterns and amount of deformation of the interlayer insulating film is simulated to discuss an appropriate range of overlapping amount.

FIGS. 3 and 4 show the result of simulating the amount of deflection.

This simulation was carried out on a two-dimensional basis.

The maximum deformation amount (vertical direction) of the uppermost interlayer insulating film was calculated by using, as a parameter, an overlapping amount, i.e. a length of an overlapping portion (ratio) under the following conditions: five wiring layers disposed on a semiconductor substrate and the temperature of 330° C.

In this simulation, the conductive patterns were disposed in all of the wiring layers. Each wiring layer had a hollow structure, and each conductive pattern had an island shape (square: 1000 nm×1000 nm).

The material of each conductive pattern was copper (Cu). Each interlayer insulating film was formed by stacking $SiC_xO_y$ and $SiC_xN_y$ layers.

When the length (ratio) of each overlapping portion was set to 0 nm (0%), the maximum deformation amount was 26.0 nm. This condition corresponds to the structure of an area A in FIG. 1.

When the length (ratio) of each overlapping portion was set to 200 nm (20%), 500 nm (50%), and 700 nm (70%), the maximum deformation amount was 14.3 nm, 11.4 nm, and 11.1 nm, respectively.

When the length (ratio) of each overlapping portion was set to 1000 nm (100%), the maximum deformation amount was 10.4 nm. This condition corresponds to the structure of an area B in FIG. 1.

These simulation results shows that deformation amount of an interlayer insulating film, particularly the maximum deformation amount of the uppermost interlayer insulating film, became smaller with the increase in overlapping amount.

The acceptable range of deformation amount is varied depending on a generation of the LSI, i.e. depending on the conditions such as the minimum processing size by a lithography method. The deformation amount range of about 15 nm or less will make it possible to correctly draw patterns.

Accordingly, the minimum overlapping amount is preferably 20% or more (200 nm or more) of the length (1000 nm) of each conductive pattern.

The maximum overlapping amount is determined to meet conditions where no other harmful effects occur.

FIG. 5 shows the relationship between the overlapping amount and occurrence frequency of crack.

As can be seen from FIG. 5, occurrence frequency of crack is increased with the increase in overlapping amount. The crack is occurred in both of the conductive patterns and the interlayer insulating films due to a shear stress during thermal expansion.

In particular, occurrence frequency of crack rapidly increases after overlapping amount exceeds 800 nm (80%).

Accordingly, the maximum overlapping amount is preferably 80% (800 nm) or less of the length (1000 nm) of each conductive pattern.

(3) Shape of the Conductive Pattern

The shapes (including the sizes) of the conductive patterns will then be discussed.

In the aforementioned simulation, all the conductive patterns are of the same shape (island shape). In the embodiment of the present invention, the shapes of the conductive patterns are not particularly limited as long as they meet the conditions shown in "Summary."

FIG. 6 shows a modification of the structure of the device in FIG. 2.

This modification is different from the structure of the device in FIG. 2 in the sizes and positions of conductive patterns P2 in the wiring layers I2 and I4.

To be specific, the size of each of the conductive patterns P2 in the wiring layers L2 and L4 is twice as large as the size of each of the conductive patterns P1 in the wiring layers I1, I3, and I5.

For example, on the condition that all of the conductive patterns P1 and P2 is assumed to have square shapes, the size of each of the conductive patterns P1 in the wiring layers I1, I3 and I5 is set to be 1000 nm×1000 nm, and the size of each of the conductive patterns P2 in the wiring layers I2 and I4 is set to be 2000 nm×2000 nm.

In this case, the conductive patterns P2 and P1 can overlap in a manner that a conductive pattern P2 in the wiring layers I2 and I4 overlap two conductive patterns P1 in the wiring layers I1, I3, and I5.

When the conductive patterns P1 and P2 are different in shape as in the modification shown in FIG. 6, an adequate range of overlapping amount is determined on the basis of the conductive patterns P2 each having the larger size.

FIGS. 7 to 9 each show a shape example of a dummy pattern.

When a conductive pattern is a signal line, it naturally has linear shape. When a conductive pattern is a dummy pattern, the shape thereof is not particularly limited.

For example, a dummy pattern DP may be in a line shape (line pattern) as shown in FIG. 7, may be in an island shape (island pattern) as shown in FIG. 8, and may be in a network shape (network pattern) as shown in FIG. 9.

In arranging the island patterns, the island patterns in the wiring layers vertically adjacent to each other may be set to differ in size from each other as shown in FIG. 11, for example.

In arranging the island patterns, the island patterns in the wiring layers vertically adjacent to each other may be set to differ in size from each other as shown in FIG. 11, for example.

(4) Conclusion

As described above, according to the embodiment of the present invention, the interlayer insulating film can be inhibited from being deformed due to the increase in temperature because the conductive patterns (at least one of them is a dummy pattern) in two wiring layers vertically adjacent to each other have an overlapping portion where these patterns overlap each other, and a non-overlapping portion where these patterns overlap each other.

4. Application Example

The embodiment of the present invention can be applied to all kind of LSIs including a semiconductor memory, a logic LSI, and a microcomputer.

When the embodiment of the present invention is actually applied to an LSI, a plug for connecting signal lines is disposed in an interlayer insulating film between two wiring layers vertically adjacent to each other. The actual structure of the device is as follows in consideration of the above point.

The example shown in FIG. 12 shows a case where at least one of an overlying conductive pattern Pu in a wiring layer Lu and an underlying conductive pattern Pd in a wiring layer Ld is a dummy pattern. The conductive patterns Pu and Pd are isolated from each other by an interlayer insulating film I.

The conductive patterns Pu and Pd each have a barrier metal M on the side and bottom surfaces thereof. This structure is formed by using, for example, a damascene process.

The example shown in FIG. 13 shows a case where both of an overlying conductive pattern Pu in a wiring layer Lu and an underlying conductive pattern Pd in a wiring layer Ld are dummy patterns. The conductive patterns Pu and Pd are connected to each other with a plug H disposed in the interlayer insulating film I.

The conductive patterns Pu and Pd, and the plug H each have a barrier metal M on the side and bottom surfaces thereof. This structure is formed by using, for example, a dual damascene process.

The example shown in FIG. 14 shows a case where both of an overlying conductive pattern Pu in a wiring layer Lu and an underlying conductive pattern Pd in a wiring layer Ld are dummy patterns. The conductive patterns Pu and Pd are connected to each other with the plug H disposed in the interlayer insulating film I.

Furthermore, the surrounding areas of the plug H are caused to become complete cavities.

The conductive patterns Pu and Pd, and the plug H each have a barrier metal M on the side surface and bottom surface thereof. This structure is formed by using, for example, a dual damascene process.

5. Conclusion

According to the embodiment of the present invention, the interlayer insulating film can be inhibited from being deformed due to the increase in the temperature in a semiconductor device including a wiring layer with a hollow structure.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
   first and second wiring layers each having a hollow structure, the first and second wiring layers being stacked vertically adjacent to each other on a semiconductor substrate;
   a dummy pattern which is formed in the first wiring layer, and which does not function as a signal line;
   a conductive pattern formed in the second wiring layer; and
   an insulating layer arranged between the first and second wiring layers,
   wherein the dummy and conductive patterns have an overlapping portion where these patterns overlap each other, and a non-overlapping portion where these patterns do not overlap each other, as viewed from above the semiconductor substrate, and
   wherein the insulating layer is arranged between the overlapping portion of the dummy pattern and the conductive pattern.

2. The semiconductor device according to claim 1, wherein the area of the overlapping portion is 20% or more of the area of one of the dummy and conductive patterns.

3. The semiconductor device according to claim 1, wherein the area of the overlapping portion is 80% or less of the area of one of the dummy and conductive patterns.

4. The semiconductor device according to claim 1, wherein the conductive pattern is a dummy pattern which does not function as a signal line.

5. The semiconductor device according to claim 4, wherein the dummy and conductive patterns have linear shapes.

6. The semiconductor device according to claim 4, wherein the dummy and conductive patterns have island shapes.

7. The semiconductor device according to claim 4, wherein the dummy and conductive patterns have network shapes.

8. The semiconductor device according to claim 1, wherein the conductive pattern includes two section, and a portion of each of the two sections of the conductive pattern overlaps with the dummy pattern.

9. A semiconductor device, comprising:
   first and second wiring layers each having a hollow structure, the first and second wiring layers being stacked vertically adjacent to each other on a semiconductor substrate;
   a dummy pattern which is formed in the first wiring layer, and which does not function as a signal line;
   a conductive pattern formed in the second wiring layer; and
   an insulating layer arranged between the first and second wiring layers,
   wherein on the dummy pattern, a part of the hollow structure in the second wiring layer and a part of the conductive pattern in the second wiring layer are arranged, and under the conductive pattern, a part of the hollow structure in the first wiring layer and a part of the dummy pattern in the first wiring layer are arranged, and
   wherein the insulating layer is interposed between the dummy pattern and the conductive pattern at an area where the dummy pattern and the conductive pattern overlap each other as viewed from above the semiconductor substrate.

10. The semiconductor device according to claim 9, wherein the area of the part, placed on the dummy pattern, of the conductive pattern is 20% or more of the area of one of the dummy and conductive patterns.

11. The semiconductor device according to claim 9, wherein the area of the part, placed on the dummy pattern, of the conductive pattern is 80% or less of the area of one of the dummy and conductive patterns.

12. The semiconductor device according to claim 9, wherein the conductive pattern is a dummy pattern which does not function as a signal line.

13. The semiconductor device according to claim 12, wherein the dummy and conductive patterns have linear shapes.

14. The semiconductor device according to claim 12, wherein the dummy and conductive patterns have island shapes.

15. The semiconductor device according to claim 12, wherein the dummy and conductive patterns have network shapes.

16. The semiconductor device according to claim 9, wherein the conductive pattern includes two sections, and a portion of each of the two sections of the conductive pattern overlaps with the dummy pattern.

* * * * *